United States Patent
Wang et al.

(10) Patent No.: US 7,867,921 B2
(45) Date of Patent: Jan. 11, 2011

(54) REDUCTION OF ETCH-RATE DRIFT IN HDP PROCESSES

(75) Inventors: Anchuan Wang, Sunnyvale, CA (US); Young S. Lee, San Jose, CA (US); Manoj Vellaikal, Sunnyvale, CA (US); Jason Thomas Bloking, Mountain View, CA (US); Jin Ho Jeon, San Ramon, CA (US); Hemant P. Mungekar, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 183 days.

(21) Appl. No.: 12/204,503

(22) Filed: Sep. 4, 2008

(65) Prior Publication Data

US 2009/0075489 A1 Mar. 19, 2009

Related U.S. Application Data

(60) Provisional application No. 60/970,884, filed on Sep. 7, 2007.

(51) Int. Cl.
*H01L 21/31* (2006.01)
*H01L 21/469* (2006.01)

(52) U.S. Cl. .......... 438/787; 438/424; 438/800; 257/E21.546; 257/E21.278; 257/E21.494

(58) Field of Classification Search .......... 438/800, 438/905, 424, 787, FOR. 227, FOR. 494; 134/1.1, 1.2, 1.3; 257/E21.546, E21.278, 257/E21.494
See application file for complete search history.

(56) References Cited

U.S. PATENT DOCUMENTS 5,849,092 A * 12/1998 Xi et al. .......... 134/1.1
6,071,573 A    6/2000 Koemtzopoulos et al.
6,090,718 A * 7/2000 Soga et al. .......... 438/714
6,125,859 A * 10/2000 Kao et al. .......... 134/1.1
6,170,428 B1   1/2001 Redeker et al.
6,274,500 B1 * 8/2001 Xuechun et al. .......... 438/706
6,479,098 B1   11/2002 Yoo et al.
6,544,345 B1 * 4/2003 Mayer et al. .......... 134/28

(Continued)

FOREIGN PATENT DOCUMENTS

CN    1473353 A    4/2004

OTHER PUBLICATIONS

EP Search Report mailed Aug. 7, 2009; Application No. 08163822.3, 7 pages.

(Continued)

*Primary Examiner*—Matthew S Smith
*Assistant Examiner*—Quovaunda Jefferson
(74) *Attorney, Agent, or Firm*—Townsend and Townsend and Crew

(57) ABSTRACT

A processing chamber is seasoned by providing a flow of season precursors to the processing chamber. A high-density plasma is formed from the season precursors by applying at least 7500 W of source power distributed with greater than 70% of the source power at a top of the processing chamber. A season layer having a thickness of at least 5000 Å is deposited at one point using the high-density plasma. Each of multiple substrates is transferred sequentially into the processing chamber to perform a process that includes etching. The processing chamber is cleaned between sequential transfers of the substrates.

19 Claims, 8 Drawing Sheets

U.S. PATENT DOCUMENTS

| | | |
|---|---|---|
| 6,584,987 B1 | 7/2003 | Cheng et al. |
| 6,846,745 B1 | 1/2005 | Papasouliotis et al. |
| 6,903,031 B2 | 6/2005 | Karim et al. |
| 7,081,414 B2 | 7/2006 | Zhang et al. |
| 7,183,214 B2 | 2/2007 | Nam et al. |
| 7,217,658 B1 | 5/2007 | Bayman et al. |
| 2003/0216006 A1 | 11/2003 | Li et al. |
| 2004/0043626 A1 | 3/2004 | Chou San et al. |
| 2004/0045577 A1* | 3/2004 | Ji et al. ............... 134/1.1 |
| 2004/0048485 A1 | 3/2004 | Min et al. |
| 2004/0126952 A1 | 7/2004 | Gondhalekar et al. |
| 2004/0145029 A1 | 7/2004 | Adetutu et al. |
| 2004/0166694 A1 | 8/2004 | Won et al. |
| 2004/0192061 A1 | 9/2004 | Sasaki et al. |
| 2004/0245091 A1 | 12/2004 | Karim et al. |
| 2004/0251236 A1 | 12/2004 | Zhang et al. |
| 2005/0103266 A1 | 5/2005 | Chandran et al. |
| 2005/0124166 A1 | 6/2005 | Krishnaraj et al. |
| 2005/0136610 A1 | 6/2005 | Kitagawa et al. |
| 2005/0250340 A1* | 11/2005 | Chen et al. ............... 438/758 |
| 2006/0046508 A1 | 3/2006 | Nemani et al. |
| 2006/0292894 A1 | 12/2006 | Vellakai et al. |

OTHER PUBLICATIONS

Australian Patent Office Search Report from corresponding SG application, mailed Feb. 12, 2009; Application No. SG 200806501-3, 4 pages.

Australian Patent Office Search Report from related SG application, mailed Feb. 12, 2009; Application No. SG 200806500-5, 3 pages.

Notice of Allowance for U.S. Appl. No. 12/204,523 mailed on Feb. 17, 2010; 8 pages.

Non-Final Office Action for U.S. Appl. No. 12/204,523 mailed on Aug. 4, 2009; 12 pages.

Non-Final Office Action for U.S. Appl. No. 12/204,523 mailed on Apr. 15, 2009; 14 pages.

Non-Final Office Action for U.S. Appl. No. 11/757,637 mailed on Sep. 2, 2009; 9 pages.

* cited by examiner

REDUCTION OF ETCH-RATE DRIFT IN HDP PROCESSES

CROSS REFERENCE TO RELATED APPLICATION

This application is a nonprovisional of, and claims the benefit of the filing date of U.S. patent application Ser. No. 60/970,884, entitled "INTEGRATED PROCESS MODULATION, filed Sep. 7, 2007 by Anchuan Wang et al., the entire disclosure of which is incorporated herein by reference for all purposes.

This application is also related to commonly assigned U.S. patent application Ser. No. 12/204,523, entitled "IMPURITY CONTROL IN HDP-CVD DEP/ETCH/DEP PROCESSES," filed Sep. 4, 2008 by Anchuan Wang et al., allowed as U.S. Pat. No. 7,745,350, and to U.S. patent application Ser. No. 11/757,637, entitled "GAPFILL EXTENSION OF HDP-CVD INTEGRATED PROCESS MODULATION SIO2 PROCESS," filed Jun. 4, 2007 by Anchuan Wang et al., now abandoned, the entire disclosure of each of which is incorporated herein by reference for all purposes.

BACKGROUND OF THE INVENTION

One of the persistent challenges faced in the development of semiconductor technology is the desire to increase the density of circuit elements and interconnections on substrates without introducing spurious interactions between them. Unwanted interactions are typically prevented by providing gaps or trenches that are filled with electrically insulative material to isolate the elements both physically and electrically. As circuit densities increase, however, the widths of these gaps decrease, increasing their aspect ratios and making it progressively more difficult to fill the gaps without leaving voids. The formation of voids when the gap is not filled completely is undesirable because they may adversely affect operation of the completed device, such as by trapping impurities within the insulative material.

Common techniques that are used in such gapfill applications are chemical-vapor deposition ("CVD") techniques. Conventional thermal CVD processes supply reactive gases to the substrate surface where heat-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes when compared with conventional thermal CVD processes. These advantages may be further exploited by high-density-plasma ("HDP") CVD techniques, in which a dense plasma is formed at low vacuum pressures so that the plasma species are even more reactive. While each of these techniques falls broadly under the umbrella of "CVD techniques," each of them has characteristic properties that make them more or less suitable for certain specific applications.

HDP-CVD systems form a plasma that is at least approximately two orders of magnitude greater than the density of a standard, capacitively coupled plasma CVD system. Examples of HDP-CVD systems include inductively coupled plasma systems and electron cyclotron resonance (ECR) plasma systems, among others. HDP-CVD systems generally operate at lower pressure ranges than low-density plasma systems. The low chamber pressure employed in HDP-CVD systems provides active species having a long mean-free-path and reduced angular distribution. These factors, in combination with the plasma density, contribute to a significant number of constituents from the plasma reaching even the deepest portions of closely spaced gaps, providing a film with improved gapfill capabilities compared with films deposited in a low-density plasma CVD system.

Another factor that allows films deposited by HDP-CVD techniques to have improved gapfill characteristics is the promotion of sputtering by the high density of the plasma, simultaneous with film deposition. The sputtering component of HDP deposition processes slows deposition on certain features, such as the corners of raised surfaces, thereby contributing to the increased gapfill ability of HDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma towards the substrate. The electric field can be applied throughout the HDP deposition process for further promotion of sputtering and to provide better gapfill characteristics for a given film.

It was initially thought that because of their simultaneous deposition/sputter nature, HDP-CVD processes could fill the gaps or trenches that were created in almost any application. Semiconductor manufacturers have discovered, however, that there is a practical limit to the aspect ratio of gaps that HDP-CVD processes are able to fill. For example, one HDP-CVD process commonly used to deposit a silicon oxide gapfill film forms a plasma from a process gas that includes silane $SiH_4$, molecular oxygen $O_2$, and argon Ar. It has been reported that when such a process is used to fill certain narrow-width high-aspect-ratio gaps, the sputtering caused by argon in the process gas may hamper the gapfill efforts. Specifically, it has been reported that material sputtered by argon in the process redeposits on the upper portions of the sidewalls of the gaps being filled at a rate faster than at the lower portions. This, in turn, may result in the formation of a void in the gap if the upper areas of regrowth join before the gap is completely filled.

FIG. 1 provides schematic cross-sectional views of a silicon oxide film at different stages of deposition to illustrate the potential gapfill limitation associated with some CVD processes. The gapfill problem is illustrated in somewhat exaggerated form to illustrate the problem better. The top portion of FIG. 1 shows the initial structure 104 in which a gap 120 is defined by two adjacent features 124 and 128 having horizontal surfaces 122, with the horizontal surface at the bottom of the gap being denoted 132. As shown in structure 108, i.e. the second portion of the figure from the top, a conventional HDP-CVD silicon oxide deposition process results in direct deposition on the horizontal surface 132 at the bottom of the gap 120 and on the horizontal surfaces 122 above the features 124 and 128. It also, however, results in indirect deposition (referred to as "redeposition") on the sidewalls 140 of the gap 120 due to recombination of material sputtered from the silicon oxide film as it grows. In certain small-width, high-aspect-ratio applications, the continued growth of the silicon oxide film results in formations 136 on the upper section of the sidewall 140 that grow towards each other at a rate of growth exceeding the rate at which the film grows laterally on the lower portions of the sidewall. This trend is shown in structures 108 and 112, with the final result in structure 116 being the formation of a void 144 within the film. The probability of forming a void is very directly related to the rate and character of the redeposition.

There accordingly remains a general need in the art for improving gapfill techniques.

BRIEF SUMMARY OF THE INVENTION

Embodiments of the invention provide methods of depositing film on a plurality of substrates. In a first set of embodiments, a processing chamber is seasoned by providing a flow of season precursors to the processing chamber. A high-density plasma is formed from the season precursors by applying at least 7500 W of source power distributed with greater than 70% of the source power at a top of the processing chamber. A season layer having a thickness of at least 5000 Å is deposited at one point using the high-density plasma. Each of the plurality of substrates is transferred sequentially into the processing chamber to perform a process on the each of the plurality of substrates that includes etching. The processing chamber is cleaned between sequential transfers of the each of the plurality of substrates.

In different embodiments, the thickness of at least 5000 Å may comprise a thickness of at least 7500 Å or may comprise a thickness of at least 10,000 Å. The flow of season precursors may be provided as a flow of a silicon-containing gas such as $SiH_4$ and a flow of an oxygen-containing gas such as $O_2$. The flow rate of the oxygen-containing gas may be less than a flow rate of the silicon-containing gas, or may be less than 0.8 of a flow rate of the silicon-containing gas in different embodiments. In some instances, a flow of a gas nonreactive with the silicon-containing gas and with the oxygen-containing gas may additionally be provided, sometimes with a flow rate less than 200 sccm.

In a second set of embodiments, a processing chamber is seasoned and each of the plurality of substrates is transferred sequentially into the processing chamber to perform a process on the each of the plurality of substrates that includes etching. The processing chamber is cleaned between sequential transfers of the each of the plurality of substrates by performing a partial clean of the processing chamber, thereafter heating the processing chamber, and thereafter completing the clean of the processing chamber.

Each of performing the partial clean of the processing chamber and completing the clean of the processing chamber may comprise flowing a halogen precursor to the processing chamber and forming a high-density plasma from the halogen precursor. One example of a suitable halogen precursor is $F_2$. The partial clean may be performed to greater than 75% of an endpoint of the clean. The processing chamber may be heated by flowing heat gases to the processing chamber and forming a high-density plasma from the heat gases. Examples of heat gases include $O_2$, Ar, and He, among others. The high-density plasma may be formed from the heat gases by applying a source power distributed approximately equally between top and side sources.

A further understanding of the nature and advantages of the present invention may be realized by reference to the remaining portions of the specification and the drawings.

DETAILED DESCRIPTION OF THE INVENTION

Embodiments of the invention are directed to methods of depositing films on substrates that incorporate etching steps. In particular exemplary applications of the invention, methods are provided of depositing a silicon oxide layer to fill a gap in a surface of a substrate using a high-density-plasma CVD process. Silicon oxide films deposited according to the techniques of the invention have excellent gapfill capabilities and are able to fill gaps encountered in, for example, shallow-trench-isolation ("STI") structures. Films deposited by the methods of the invention are thus suitable for use in the fabrication of a variety of integrated circuits, including those that have a feature size on the order of or less than 45 nm.

One discovery that was made by the inventors as part of their investigations into such deposition methods is that there is a systematic trend for the etch rate during etching portions of the methods to decrease as more substrates are processed. This "etch-rate drift" occurs even when the process conditions for each substrate are substantially the same.

Figure 1:
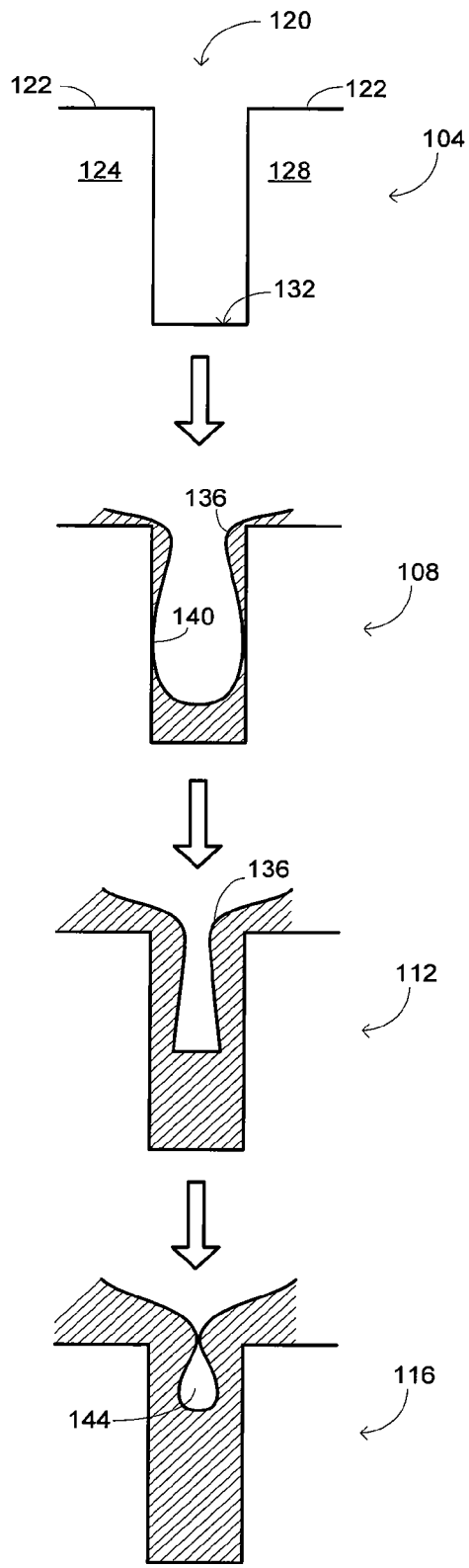
FIG. 1 provides schematic cross-sectional drawings illustrating the formation of a void during a prior-art gapfill process.
Figure 2:
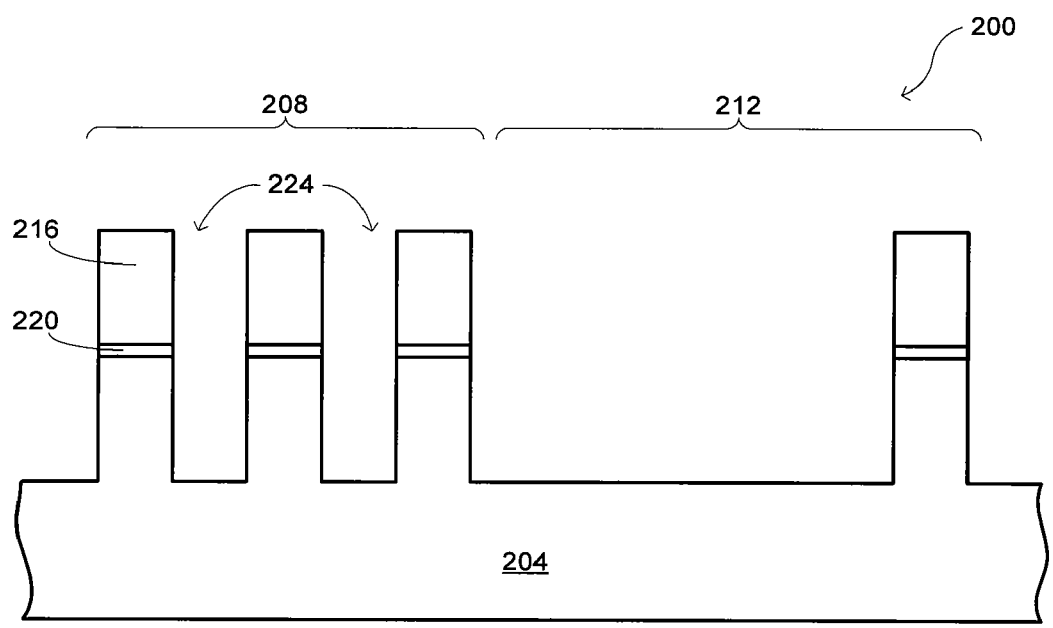
FIG. 2 is a simplified cross-sectional view of a partially completed integrated circuit that includes a plurality of shallow-trench-isolation structures.

The types of structures that may be filled according to embodiments of the invention are illustrated by FIG. 2, which provides a simplified cross-sectional view of a partially completed integrated circuit 200. This integrated circuit is formed over a substrate 204 that includes a plurality of STI structures, each of which is typically created by forming a thin pad oxide layer 220 over the surface of the substrate 204 and then forming a silicon nitride layer 216 over the pad oxide layer 220. The nitride and oxide layers are then patterned using standard photolithography techniques and trenches 224 are etched through the nitride/oxide stack into the substrate 204. FIG. 2 shows that the integrated circuit may comprise areas 208 that are relatively densely packed with transistors or other active devices, and may comprise open areas 212 that are relatively isolated. Active devices in the open areas 212 may be separated from each other by more than an order of magnitude than separations in the densely packed areas 208, but as used herein "open areas" are considered to be areas in which gaps have a width at least five times a width of a gap in a "dense area."

Embodiments of the invention provide methods for filling the trenches 224 with an electrically insulating material such as silicon dioxide using a deposition process that has good gapfill properties. In some instances, prior to the gapfill process, an initial lining layer is deposited over the substrate as an in situ steam generation ("ISSG") or other thermal oxide layer, or perhaps a silicon nitride layer. One benefit to depositing such a liner prior to filling the trenches 224 is to provide appropriate corner rounding, which may aid in avoiding such effects as early gate breakdown in transistors that are formed.

As used herein, a high-density-plasma process is a plasma CVD process that includes simultaneous deposition and sputtering components and that employs a plasma having an ion density on the order of $10^{11}$ ions/cm$^3$ or greater. The relative levels of the combined deposition and sputtering characteristics of the high-density plasma may depend on such factors as the flow rates used to provide the gaseous mixture, the source power levels applied to maintain the plasma, the bias power applied to the substrate, and the like. The combination of such factors may conveniently be quantified with a "deposition/sputter ratio," sometimes denoted D/S to characterize the process:

$$\frac{D}{S} \equiv \frac{\text{(net deposition rate)} + \text{(blanket sputtering rate)}}{\text{(blanket sputtering rate)}}.$$

The deposition/sputter ratio increases with increased deposition and decreases with increased sputtering. As used in the definition of D/S, the "net deposition rate" refers to the deposition rate that is measured when deposition and sputtering are occurring simultaneously. The "blanket sputter rate" is the sputter rate measured when the process recipe is run without deposition gases; the pressure within the process chamber is adjusted to the pressure during deposition and the sputter rate measured on a blanket thermal oxide.

Other equivalent measures may be used to quantify the relative deposition and sputtering contributions of the HDP process, as is known to those of skill in the art. A common alternative ratio is the "etching/deposition ratio,"

$$\frac{E}{D} \equiv \frac{\text{(source-only deposition rate)} - \text{(net deposition rate)}}{\text{(source-only deposition rate)}},$$

which increases with increased sputtering and decreases with increased deposition. As used in the definition of E/D, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of D/S ratios. While D/S and E/D are not precise reciprocals, they are inversely related and conversion between them will be understood to those of skill in the art.

The desired D/S ratios for a given step in the HDP-CVD processes are generally achieved by including flows of precursor gases and, in some instances, flows of a fluent gas, which may also act as a sputtering agent. The elements comprised by the precursor gases react to form the film with the desired composition. For example, to deposit a silicon oxide film, the precursor gases may include a silicon-containing gas, such as silane SiH$_4$, and an oxidizing gas reactant such as molecular oxygen O$_2$. Dopants may be added to the film by including a precursor gas with the desired dopant, such as by including a flow of SiF$_4$ to fluorinate the film, including a flow of PH$_3$ to phosphorate the film, including a flow of B$_2$H$_6$ to boronate the film, including a flow of N$_2$ to nitrogenate the film, and the like. The fluent gas may be provided with a flow of H$_2$ or with a flow of an inert gas, including a flow of He, or even a flow a heavier inert gas, such as Ne, Ar, or Xe. The level of sputtering provided by the different fluent gases is directly related to their atomic mass (or molecular mass in the case of H$_2$), with H$_2$ producing even less sputtering than He. Embodiments of the invention generally provide fluent-gas flows that have an average molecular mass less than 5 amu. This may be achieved by using flows of a single low-mass gas, such as with a flow of substantially pure H$_2$ or with a flow of substantially pure He. Alternatively, flows may sometimes be provided of multiple gases, such as by providing both a flow of H$_2$ and a flow of He, which mix in the HDP-CVD process chamber. Alternatively, the gas may sometimes be premixed so that a flow of H$_2$/He is provided in a mixed state to the process chamber. It is also possible to provide separate flows of higher-mass gases, or to include higher-mass gases in the premixture, with the relative flow rates and/or concentrations of the premixture being selected to maintain an average molecular mass less than 5 amu.

In high-aspect-ratio structures, the use of relatively high flow rates of low-mass fluent gases has been found generally to improve gapfill capability when compared with the more traditional use of fluent gases such as Ar. This is believed to be a consequence of the reduction in redeposition that is achieved by using He or H$_2$ as a fluent gas so that closure of the gap occurs less quickly. But even with the use of such low-mass fluent gases, there is a risk of corner clipping during deposition. This effect may be understood with reference to FIGS. 3A and 3B, which show the effect of the sputtering component of an HDP process respectively for a gap in a densely packed area and for a gap in an open area.

Figure 3A:
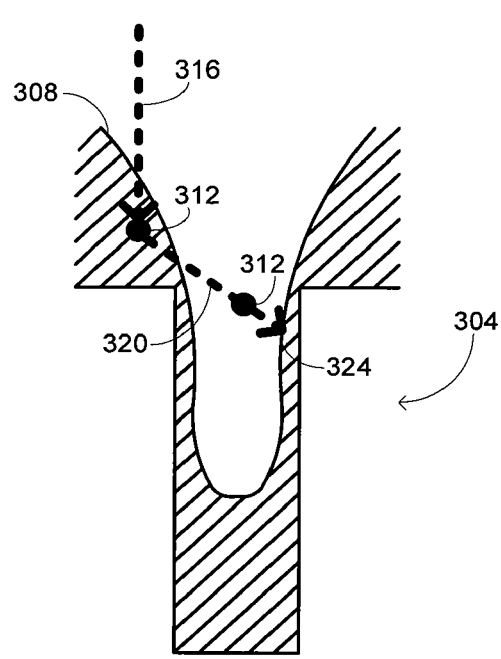
FIGS. 3A and 3B are schematic diagrams that respectively illustrate gapfill characteristics of densely packed areas and open areas in a structure.

In particular, the gap 304 in FIG. 3A is a high-aspect-ratio gap, with the material deposited using an HDP-CVD process forming a characteristic cusp structure 308 over the horizontal surfaces. Redeposition occurs as material 312 is sputtered from the cusp 308 in response to the impact of plasma ions along path 316. The sputtered material 312 follows a path 320 that encounters the sidewall 324 on the opposite side of the gap 304. This effect is symmetrical so that as material is sputtered away from the left side of the gap onto the right side, material is also sputtered away from the right side of the gap onto the left side. The redeposition of material protects against excess sputtering resulting in clipping of the corners.

Figure 3B:
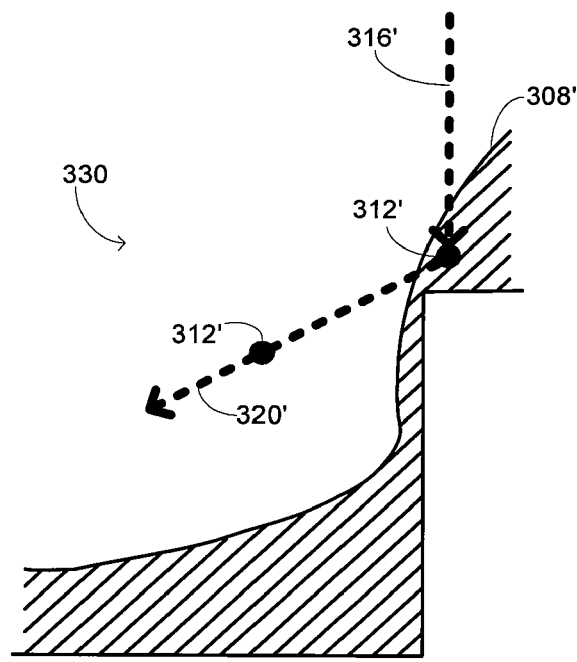

This symmetry is not present in the open areas, as illustrated with the open-area structure 330 shown in FIG. 3B. in this instance, the deposition causes the formation of a similar cusp 308', but when material 312' is sputtered along path 320' in response to the impact of plasma ions along path 316', the opposite side of the gap is too far away for the redeposition to be protective. The corner of the structure in FIG. 3B suffers the same ejection of material as does the corner of the structure in FIG. 3A, without the compensating effect of receiving material sputtered from the opposite side of the gap. As a consequence, there is an increased risk of clipping the corner and damaging the underlying structure.

Figure 4A:
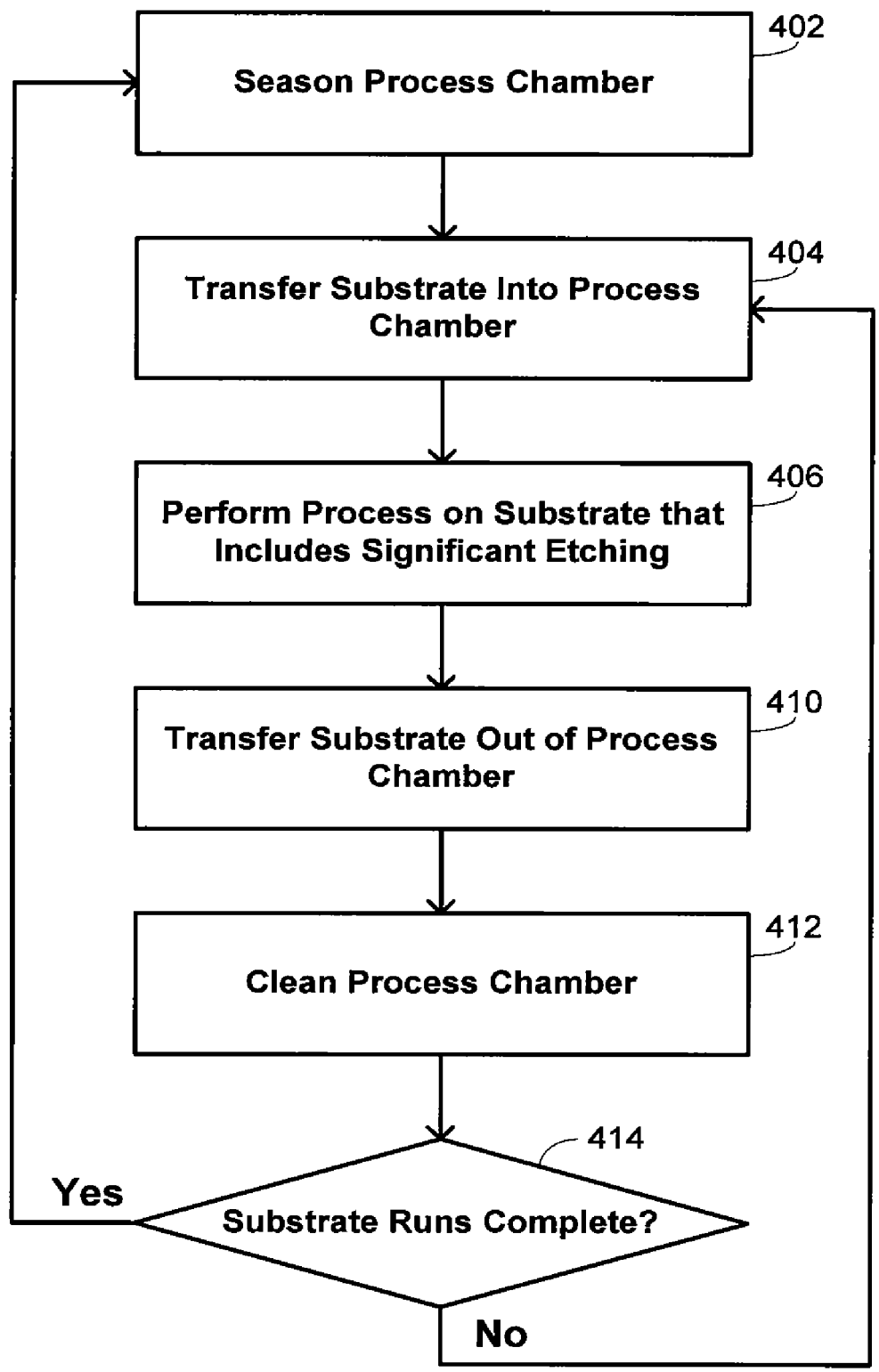
FIG. 4A is a flow diagram summarizing methods for depositing films on substrates in embodiments of the invention.

Methods of the invention are summarized with the flow diagram of FIG. 4A, which provides an overview of such methods. These methods are applied to a run of several substrates, with processes being performed on each of the substrates in a common processing chamber. The methods begin at block 402 by seasoning the processing chamber, i.e. by coating internal structures of the processing chamber with material, one example of which comprises SiO$_2$. At block 404, a substrate is transferred into the processing chamber so that the process may be performed on that substrate at block 406. This process includes significant etching, even when the overall result of application of the process is a net deposition of material. At block 410, the substrate is transferred out of the processing chamber, which is cleaned at block 412.

A check is made at block 414 whether the entire substrate run has been completed. A typical substrate run might include five substrates, but could use a larger or smaller number of substrates in different specific embodiments. If the substrate run is not complete, the next substrate in the run is transferred into the processing chamber at block 404 and the method repeated with this next substrate. Once the entire substrate run has been completed, the process chamber may be seasoned again at block 402 in preparation for another substrate run, using the same process at block 406 or using a different process.

Figure 4B:
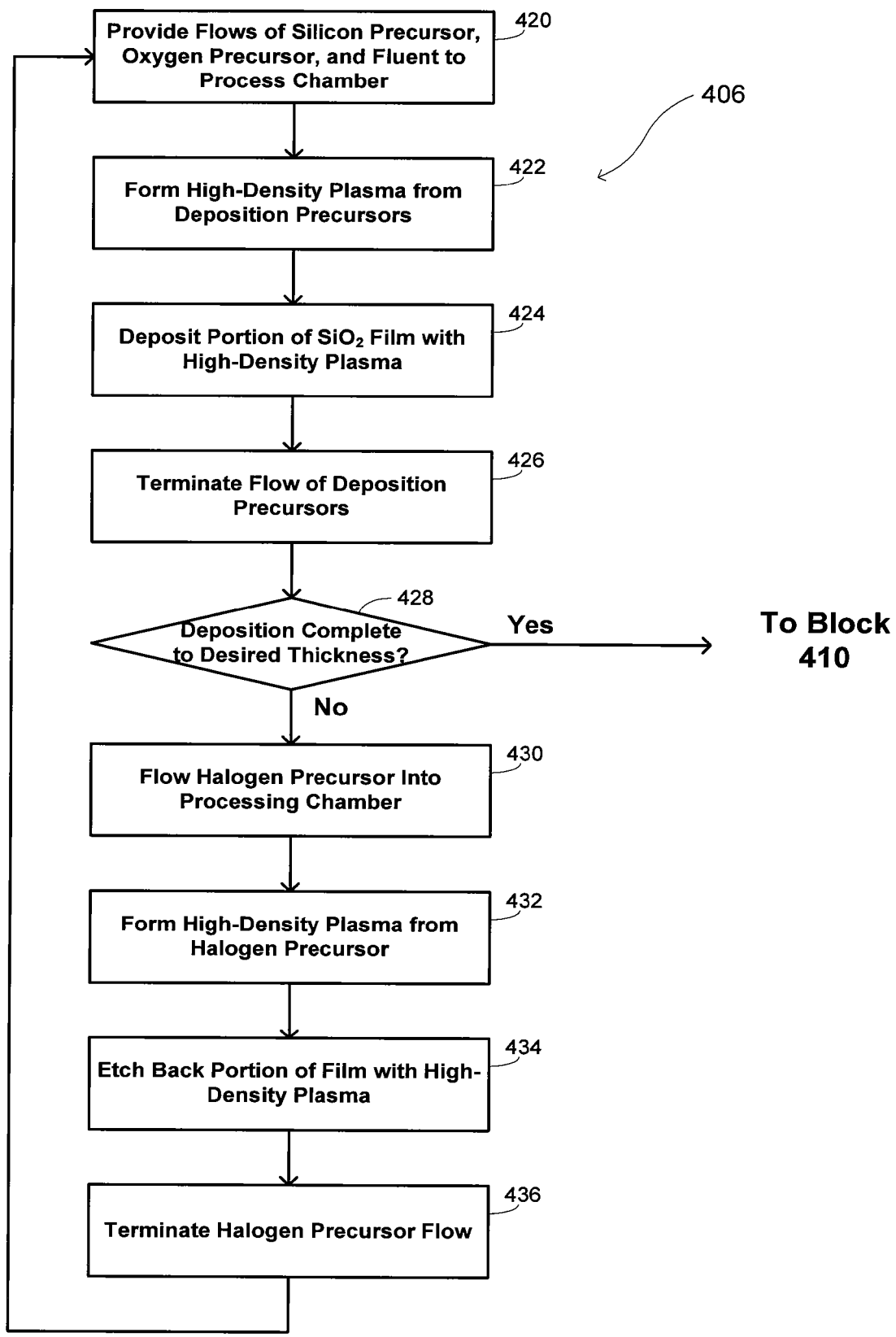
FIG. 4B is a flow diagram summarizing a particular deposition process that may be used with the methods of FIG. 4A that interleaves deposition and etching steps.

FIG. 4B provides details of what process might be used at block 406. In this example, deposition is achieved on a substrate using a dep/etch/dep process, but the methods of the invention may apply more generally to other types of processes that have a significant etching component. The substrate is typically a semiconductor wafer, such as a 200-mm or 300-mm-diameter wafer.

Flows of precursor gases are provided to the chamber at block 420, including a flow of a silicon precursor, a flow of an oxygen precursor, and a flow of a fluent gas. Table I provides exemplary flow rates for deposition of an undoped silicate glass ("USG") film using flows of monosilane $SiH_4$, molecular oxygen $O_2$, and $H_2$, although it should be understood that other precursor gases, including dopant sources, and other fluent gases may be used as discussed above.

TABLE I

Exemplary Flow Rates for USG Deposition

| Flow Rates for 200-mm Wafer Process | | Flow Rates for 300-mm Wafer Process | |
|---|---|---|---|
| $\mathcal{F}(SiH_4)$ | 10-200 sccm | $\mathcal{F}(SiH_4)$ | 10-200 sccm |
| $\mathcal{F}(O_2)$ | 20-300 sccm | $\mathcal{F}(O_2)$ | 20-300 sccm |
| $\mathcal{F}(H_2)$ | 50-400 sccm | $\mathcal{F}(H_2)$ | 50-600 sccm |
| $\mathcal{F}(He)$ | 50-400 sccm | $\mathcal{F}(He)$ | 50-600 sccm |

As the table indicates, the flow rates of the precursor gases may be similar for 200-mm and 300-mm-diameter wafers, but the flow rate of the fluent gas is generally higher.

A high-density plasma is formed from the gaseous flows at block 422 by coupling energy into the chamber. A common technique for generating a high-density plasma is to couple rf energy inductively. The D/S ratio is determined not only by the flow rates for the gases, but also by the power density of energy coupled into the chamber, by the strength of a bias that may be applied to the substrate, by the temperature within the chamber, by the pressure within the chamber, and other such factors. For deposition of an initial portion of the film AT BLOCK 424, such processing parameters may in certain embodiments be selected to provide a D/S ratio that exceeds 20 while simultaneously providing a relatively low deposition rate of 900-6000 Å/min. The inventors have discovered with very small feature sizes that gapfill characteristics are generally improved with such a combination of low deposition rates and high D/S ratios.

After completion of the deposition, the flows of the deposition precursors are terminated at block 426 and a check made whether the desired thickness of the film has been reached at block 428. Embodiments of the invention include at least two deposition stages separated by an etching stage, and may frequently have 5-15 deposition stages or even more deposition stages depending on the specific characteristics of the gap being filled.

An etching phase of the process may begin at block 430 by flowing a halogen precursor, which typically comprises a fluorine precursor such as $NF_3$ or a chlorofluorocarbon. A high-density plasma is formed from the halogen precursor at block 432 using a high source power density. In some embodiments, the source power density is between about 80,000 and 140,000 W/m², which corresponds to a total source power between about 6000 and 10,000 W for a 300-mm-diameter wafer and to a total source power between about 2500 and 4500 W for a 200-mm-diameter wafer. The inventors have found that the use of a high source power causes the deposition profile to be more symmetric than the use of lower source powers. In some embodiments, the total source power is distributed among top and side sources so that a majority of the source power is provided from side sources. For instance, the side source power may be 1-5 times the top source power, with it being three times the top source power in a particular embodiment.

The resulting halogen plasma is used at block 434 to etch back the deposited film. While the specific amount of material that may be etched is relatively dependent on the specific configuration of the substrate structure, it is generally true that the amount of material etched may be greater in later etching cycles than in earlier etching cycles. This is a general consequence of the fact that the overall topology of the substrate changes as a result of the sequence of deposition and etching steps. The general trend with the sequence of steps is that the topology becomes more amenable to greater etch amounts during the etching phase of the cycle. At block 436, the halogen precursor flow is terminated so that the process may return to a deposition phase by again flowing flows of a silicon precursor, an oxygen precursor, and a fluent gas at block 420.

It is generally expected that the same precursors will be used for deposition of material during each of the deposition phases and that the same precursor will be used for removing material during the etching phase, although this is not a requirement of the invention. The amount of material deposited during each of the deposition phases is typically between 300 and 100 Å, with the overall process requiring fewer cycles when larger deposition amounts are used per cycle. When each cycle deposits 300 Å, it may be necessary to use about six times as many cycles to deposit the same amount of material as when each cycle deposits 100 Å.

Figure 4C:
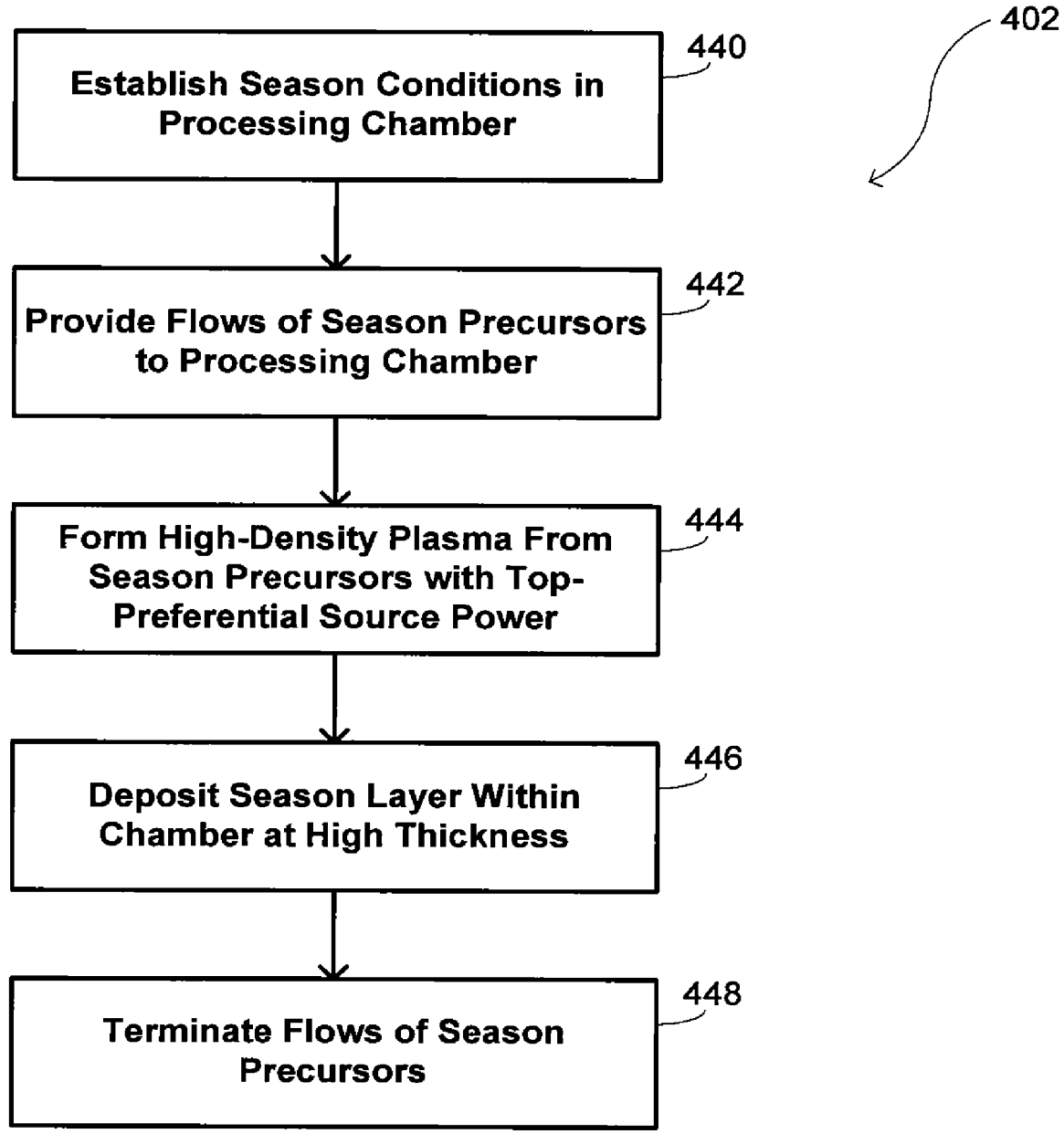
FIG. 4C is a flow diagram summarizing methods of seasoning a process chamber that may be used in certain embodiments as part of the method of FIG. 4A.

FIG. 4C illustrates the seasoning process that may be used at block 402 in some embodiments. The seasoning process begins at block 440 by establishing seasoning conditions within the chamber. In certain embodiments, such conditions include a chamber pressure between 25 and 65 mtorr. Flows of season precursors are provided at block 442. In embodiments where the season includes a $SiO_2$ coating, the precursors may include a silicon-containing gas such as a silane and an oxygen containing gas. For instance, the silicon precursor could include $SiH_4$ and the oxygen precursor could include $O_2$. In some embodiments a flow rate of the oxygen-containing gas is less than a flow rate of the silicon-containing gas, may be less than 0.9 times the flow rate of the silicon-containing gas, may be less than 0.8 times the flow rate of the silicon-containing gas, may be less than 0.7 times the flow rate of the silicon-containing gas, may be less than 0.6 times the flow rate of the silicon-containing gas, or may be less than 0.5 times the flow rate of the silicon-containing gas. For example, in one embodiment that uses $SiH_4$ and $O_2$, the flow rate of $O_2$ is 300 sccm and the flow rate of $SiH_4$ is 470 sccm, a ratio of flow rates approximately equal to 0.65. The flows provided at block 442 may also sometimes include nonreactive gases, such as embodiments that use He, Ne, or Ar. Flow rates of such nonreactive gases are typically less than 200 sccm to reduce the sputter effect, and may be 0 sccm.

At block 444, a high-density plasma is formed from the season precursors by the coupling of energy into the processing chamber as described above. Energy is preferably coupled preferentially with application of a top source power, with embodiments of the invention having greater than 70% of the source power applied at the top of the chamber, greater than 80% of the source power applied at the top of the chamber, greater than 90% of the source power applied at the top of the chamber, or even by having 100% of the source power applied at the top of the chamber. A typical power that is applied is greater than 7500 W, with one embodiment using approximately 9000 W applied entirely at the top of the processing chamber.

This high-density plasma is used to deposit the season layer at block 446. While it is generally anticipated that the thickness of the season layer may be nonuniform, in some embodiments it has a thickness of at least 5000 Å at one point, has a thickness of at least 6000 Å at one point, has a thickness of at least 7500 Å at one point, has a thickness of at least 10,000 Å at one point, or has a thickness of at least 12,500 Å at one point. After deposition of the season layer, the flows of the season precursors are stopped at block 448.

Figure 4D:
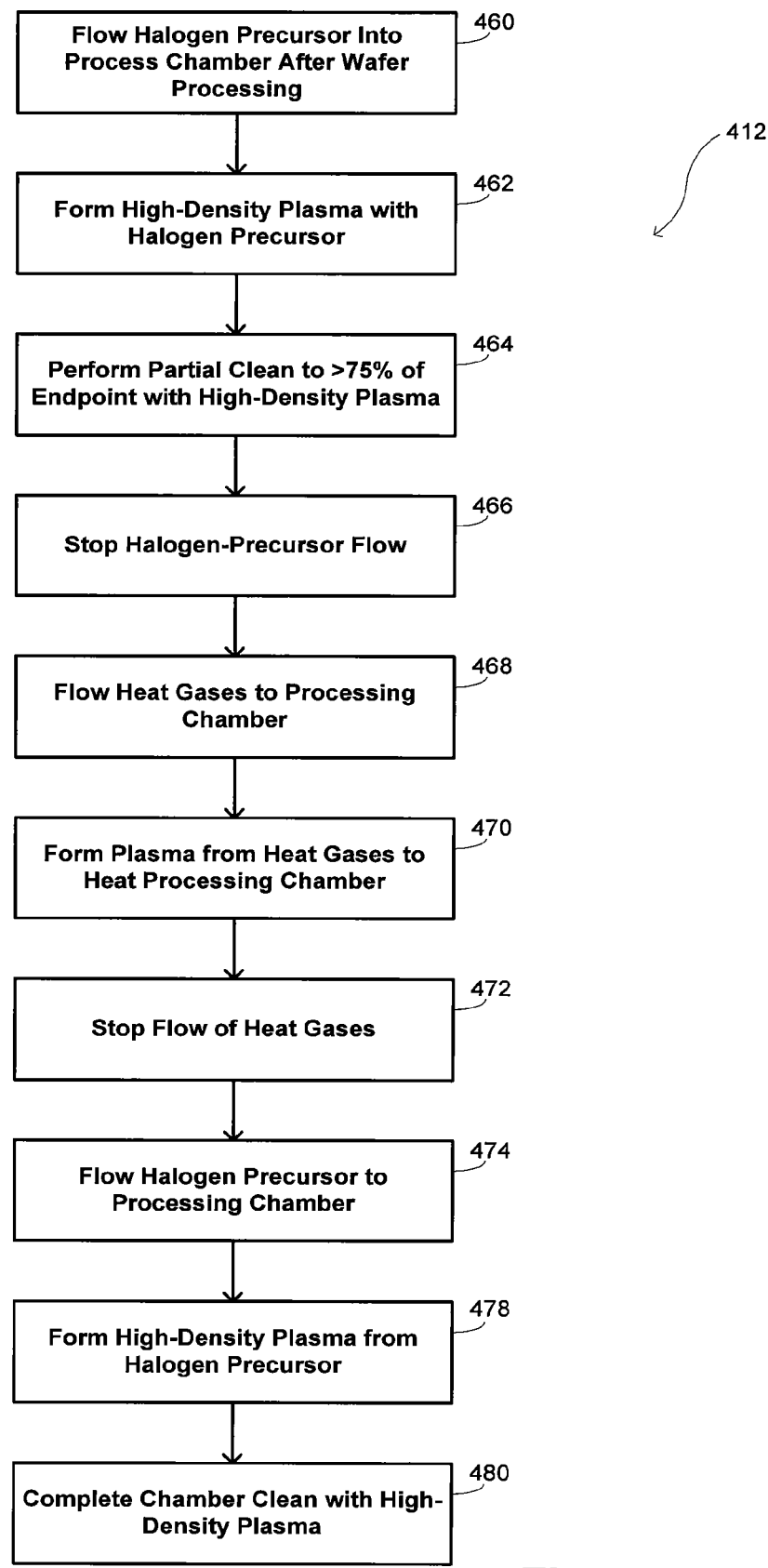
FIG. 4D is a flow diagram summarizing methods of cleaning a process chamber that may be used in certain embodiments as part of the method of FIG. 4A.

FIG. 4D provides a flow diagram that illustrates one method of cleaning the chamber at block 412 of FIG. 4A in accordance with an embodiment of the invention. This cleaning method comprises a two-stage clean with a heat-up process performed between the two stages of the clean.

Thus, at block 460, a halogen precursor such as $F_2$ is flowed into the processing chamber after a substrate has been processed. A high-density plasma is formed with the halogen precursor at block 46, and a partial clean performed at block 464 using the high-density plasma. The partial clean may in some embodiments be performed to greater than 75% of an endpoint of the process.

After the first cleaning stage has been completed, the flow of the halogen precursor is stopped at block 466. This flow is replaced with a flow of heat gases at block 468, from which a heating plasma is formed at block 470. Merely by way of example, the heat gases may include $O_2$, Ar, and/or He in different embodiments, with an exemplary source power of 12,000 W being applied in equal top and side distribution for a time between 30 and 120 seconds. This intermediate heating acts to counter the general cooling of the chamber that occurs during the cleaning.

After the flow of heat gases is stopped at block 472, a halogen-precursor flow may be resumed at block 474 and a high-density plasma formed at block 475 that is used to complete the chamber clean.

Exemplary Substrate Processing System

Figure 5A:
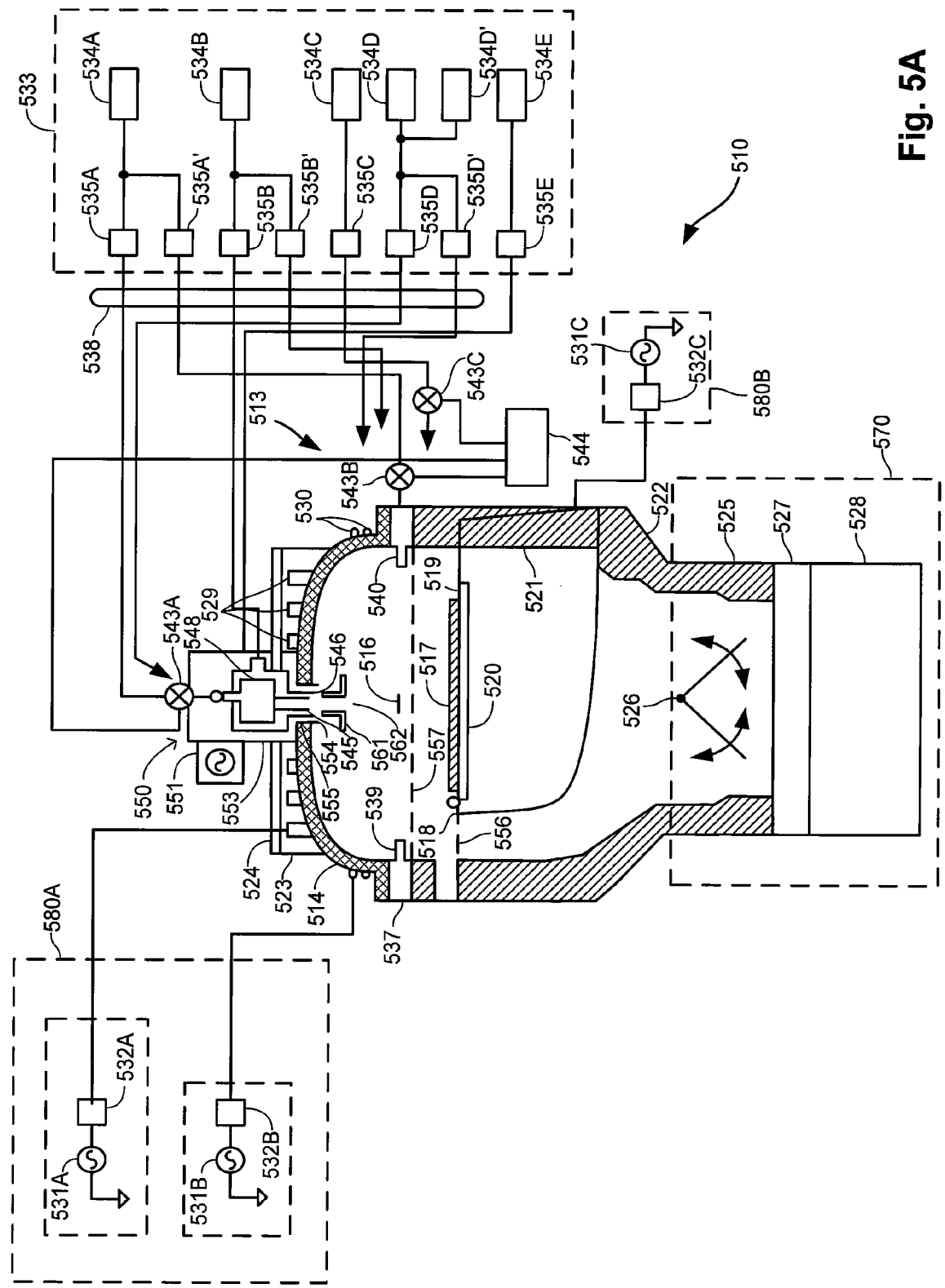
FIG. 5A is a simplified diagram of one embodiment of a high-density-plasma chemical-vapor-deposition system with which methods of the invention may be implemented.

The inventors have implemented embodiments of the invention with the ULTIMA™ system manufactured by APPLIED MATERIALS, INC., of Santa Clara, Calif., a general description of which is provided in commonly assigned U.S. Pat. No. 6,170,428, "SYMMETRIC TUNABLE INDUCTIVELY COUPLED HDP-CVD REACTOR," filed Jul. 15, 1996 by Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha, the entire disclosure of which is incorporated herein by reference. An overview of the system is provided in connection with FIGS. 5A and 5B below. FIG. 5A schematically illustrates the structure of such an HDP-CVD system 510 in one embodiment. The system 510 includes a chamber 513, a vacuum system 570, a source plasma system 580A, a bias plasma system 580B, a gas delivery system 533, and a remote plasma cleaning system 550.

The upper portion of chamber 513 includes a dome 514, which is made of a ceramic dielectric material, such as aluminum oxide or aluminum nitride. Dome 514 defines an upper boundary of a plasma processing region 516. Plasma processing region 516 is bounded on the bottom by the upper surface of a substrate 517 and a substrate support member 518.

A heater plate 523 and a cold plate 524 surmount, and are thermally coupled to, dome 514. Heater plate 523 and cold plate 524 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 513 includes a body member 522, which joins the chamber to the vacuum system. A base portion 521 of substrate support member 518 is mounted on, and forms a continuous inner surface with, body member 522. Substrates are transferred into and out of chamber 513 by a robot blade (not shown) through an insertion/removal opening (not shown) in the side of chamber 513. Lift pins (not shown) are raised and then lowered under the control of a motor (also not shown) to move the substrate from the robot blade at an upper loading position 557 to a lower processing position 556 in which the substrate is placed on a substrate receiving portion 519 of substrate support member 518. Substrate receiving portion 519 includes an electrostatic chuck 520 that secures the substrate to substrate support member 518 during substrate processing. In a preferred embodiment, substrate support member 518 is made from an aluminum oxide or aluminum ceramic material.

Vacuum system 570 includes throttle body 525, which houses twin-blade throttle valve 526 and is attached to gate valve 527 and turbo-molecular pump 528. It should be noted that throttle body 525 offers minimum obstruction to gas flow, and allows symmetric pumping. Gate valve 527 can isolate pump 528 from throttle body 525, and can also control chamber pressure by restricting the exhaust flow capacity when throttle valve 526 is fully open. The arrangement of the throttle valve, gate valve, and turbo-molecular pump allow accurate and stable control of chamber pressures up to about 1 millitorr to about 2 torr.

The source plasma system 580A includes a top coil 529 and side coil 530, mounted on dome 514. A symmetrical ground shield (not shown) reduces electrical coupling between the coils. Top coil 529 is powered by top source RF (SRF) generator 531A, whereas side coil 530 is powered by side SRF generator 531B, allowing independent power levels and frequencies of operation for each coil. This dual coil system allows control of the radial ion density in chamber 513, thereby improving plasma uniformity. Side coil 530 and top coil 529 are typically inductively driven, which does not require a complimentary electrode. In a specific embodiment, the top source RF generator 531A provides up to 2,500 watts of RF power at nominally 2 MHz and the side source RF generator 531B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 580B includes a bias RF ("BRF") generator 531C and a bias matching network 532C. The bias plasma system 580B capacitively couples substrate portion 517 to body member 522, which act as complimentary electrodes. The bias plasma system 580B serves to enhance the transport of plasma species (e.g., ions) created by the source plasma system 580A to the surface of the substrate. In a specific embodiment, bias RF generator provides up to 10,000 watts of RF power at a frequency less than 5 MHz, as discussed further below.

RF generators 531A and 531B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 532A and 532B match the output impedance of generators 531A and 531B with their respective coils 529 and 530. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 5B:
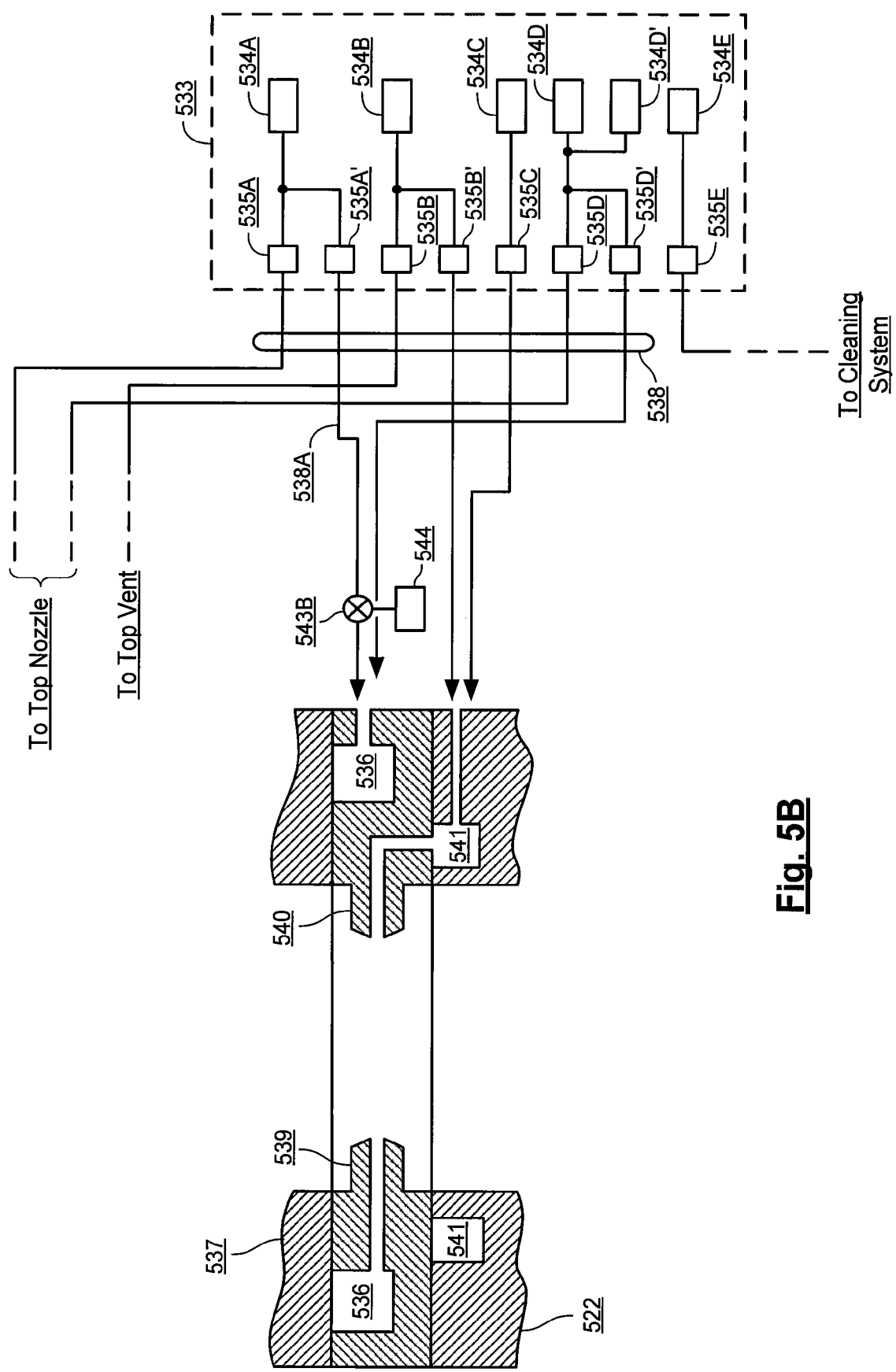
FIG. 5B is a simplified cross section of a gas ring that may be used in conjunction with the exemplary processing system of FIG. 5A.

A gas delivery system 533 provides gases from several sources, 534A-534E chamber for processing the substrate via gas delivery lines 538 (only some of which are shown). As would be understood by a person of skill in the art, the actual sources used for sources 534A-534E and the actual connection of delivery lines 538 to chamber 513 varies depending on the deposition and cleaning processes executed within chamber 513. Gases are introduced into chamber 513 through a gas ring 537 and/or a top nozzle 545. FIG. 5B is a simplified, partial cross-sectional view of chamber 513 showing additional details of gas ring 537.

In one embodiment, first and second gas sources, 534A and 534B, and first and second gas flow controllers, 535A' and 535B', provide gas to ring plenum 536 in gas ring 537 via gas delivery lines 538 (only some of which are shown). Gas ring 537 has a plurality of source gas nozzles 539 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 537 has 12 source gas nozzles made from an aluminum oxide ceramic.

Gas ring 537 also has a plurality of oxidizer gas nozzles 540 (only one of which is shown), which in a preferred embodiment are co-planar with and shorter than source gas nozzles 539, and in one embodiment receive gas from body plenum 541. In some embodiments it is desirable not to mix source gases and oxidizer gases before injecting the gases into chamber 513. In other embodiments, oxidizer gas and source gas may be mixed prior to injecting the gases into chamber 513 by providing apertures (not shown) between body plenum 541 and gas ring plenum 536. In one embodiment, third, fourth, and fifth gas sources, 534C, 534D, and 534D', and third and fourth gas flow controllers, 535C and 535D', provide gas to body plenum via gas delivery lines 538. Additional valves, such as 543B (other valves not shown), may shut off gas from the flow controllers to the chamber. In implementing certain embodiments of the invention, source 534A comprises a silane $SiH_4$ source, source 534B comprises a molecular oxygen $O_2$ source, source 534C comprises a silane $SiH_4$ source, source 534D comprises a helium He source, and source 534D' comprises a molecular hydrogen $H_2$ source.

In embodiments where flammable, toxic, or corrosive gases are used, it may be desirable to eliminate gas remaining in the gas delivery lines after a deposition. This may be accomplished using a 3-way valve, such as valve 543B, to isolate chamber 513 from delivery line 538A and to vent delivery line 538A to vacuum foreline 544, for example. As shown in FIG. 5A, other similar valves, such as 543A and 543C, may be incorporated on other gas delivery lines. Such three-way valves may be placed as close to chamber 513 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 5A, chamber 513 also has top nozzle 545 and top vent 546. Top nozzle 545 and top vent 546 allow independent control of top and side flows of the gases, which improves film uniformity and allows fine adjustment of the film's deposition and doping parameters. Top vent 546 is an annular opening around top nozzle 545. In one embodiment, first gas source 534A supplies source gas nozzles 539 and top nozzle 545. Source nozzle MFC 535A' controls the amount of gas delivered to source gas nozzles 539 and top nozzle MFC 535A controls the amount of gas delivered to top gas nozzle 545. Similarly, two MFCs 535B and 535B' may be used to control the flow of oxygen to both top vent 546 and oxidizer gas nozzles 540 from a single source of oxygen, such as source 534B. In some embodiments, oxygen is not supplied to the chamber from any side nozzles. The gases supplied to top nozzle 545 and top vent 546 may be kept separate prior to flowing the gases into chamber 513, or the gases may be mixed in top plenum 548 before they flow into chamber 513. Separate sources of the same gas may be used to supply various portions of the chamber.

A remote microwave-generated plasma cleaning system 550 is provided to periodically clean deposition residues from chamber components. The cleaning system includes a remote microwave generator 551 that creates a plasma from a cleaning gas source 534E (e.g., molecular fluorine, nitrogen trifluoride, other fluorocarbons or equivalents) in reactor cavity 553. The reactive species resulting from this plasma are conveyed to chamber 513 through cleaning gas feed port 554 via applicator tube 555. The materials used to contain the cleaning plasma (e.g., cavity 553 and applicator tube 555) must be resistant to attack by the plasma. The distance between reactor cavity 553 and feed port 554 should be kept as short as practical, since the concentration of desirable plasma species may decline with distance from reactor cavity 553. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 520, do not need to be covered with a dummy wafer or otherwise protected, as may be required with an in situ plasma cleaning process. In FIG. 5A, the plasma-cleaning system 550 is shown disposed above the chamber 513, although other positions may alternatively be used.

A baffle 561 may be provided proximate the top nozzle to direct flows of source gases supplied through the top nozzle into the chamber and to direct flows of remotely generated plasma. Source gases provided through top nozzle 545 are directed through a central passage 562 into the chamber, while remotely generated plasma species provided through the cleaning gas feed port 554 are directed to the sides of the chamber 513 by the baffle 561.

Those of ordinary skill in the art will realize that specific parameters can vary for different processing chambers and different processing conditions, without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method of depositing film on a plurality of substrates, the method comprising:
   seasoning a processing chamber, wherein seasoning the processing chamber comprises:
   providing a flow of season precursors to the processing chamber;
   forming a high-density plasma from the season precursors by applying at least 7500 W of source power distributed with greater than 70% of the source power at a top of the processing chamber; and
   depositing a season layer having a thickness of at least 5000 Å at one point with the high-density plasma;
   sequentially transferring each of the plurality of substrates into the processing chamber to perform a process on the each of the plurality of substrates that includes etching; and
   cleaning the processing chamber between sequential transfers of the each of the plurality of substrates, wherein cleaning the processing chamber comprises:
   performing a partial clean of the processing chamber;
   thereafter, heating the processing chamber; and
   thereafter, completing the clean of the processing chamber.

2. The method recited in claim 1 wherein the thickness of at least 5000 Å comprises a thickness of at least 7500 Å.

3. The method recited in claim 1 wherein the thickness of at least 5000 Å comprises a thickness of at least 10,000 Å.

4. The method recited in claim 1 wherein providing the flow of season precursors to the processing chamber comprises:
   providing a flow of a silicon-containing gas to the processing chamber; and
   providing a flow of an oxygen-containing gas to the processing chamber.

5. The method recited in claim 4 wherein a flow rate of the oxygen-containing gas is less than a flow rate of the silicon-containing gas.

6. The method recited in claim 4 wherein a flow rate of the oxygen-containing gas is less than 0.8 of a flow rate of the silicon-containing gas.

7. The method recited in claim 4 wherein the silicon-containing gas comprises $SiH_4$ and the oxygen-containing gas comprises $O_2$.

8. The method recited in claim 4 wherein providing the flow of season precursors to the processing chamber further comprises providing a flow of a gas nonreactive with the silicon-containing gas and with the oxygen-containing gas.

9. The method recited in claim 8 wherein a flow rate of the gas nonreactive with the silicon-containing gas and with the oxygen-containing gas has a flow rate less than 200 sccm.

10. A method of depositing film on a plurality of substrates, the method comprising:
    seasoning a processing chamber;
    sequentially transferring each of the plurality of substrates into the processing chamber to perform a process on the each of the plurality of substrates that includes etching; and
    cleaning the processing chamber between sequential transfers of the each of the plurality of substrates, wherein cleaning the processing chamber between sequential transfers of the each of the plurality of substrates comprises:
    performing a partial clean of the processing chamber;
    thereafter, heating the processing chamber; and
    thereafter, completing the clean of the processing chamber.

11. The method recited in claim 10 wherein performing the partial clean of the processing chamber comprises:
    flowing a halogen precursor to the processing chamber; and
    forming a high-density plasma from the halogen precursor.

12. The method recited in claim 11 wherein the halogen precursor comprises $F_2$.

13. The method recited in claim 10 wherein completing the clean of the processing chamber comprises:
    flowing a halogen precursor to the processing chamber; and
    forming a high-density plasma from the halogen precursor.

14. The method recited in claim 13 wherein completing the halogen precursor comprises $F_2$.

15. The method recited in claim 10 wherein performing the partial clean of the processing chamber comprises performing the partial clean to greater than 75% of an endpoint of the clean.

16. The method recited in claim 10 wherein heating the processing chamber comprises:
    flowing heat gases to the processing chamber; and
    forming a high-density plasma from the heat gases.

17. The method recited in claim 16 wherein the heat gases comprise a gas selected from the group consisting of $O_2$, Ar, and He.

18. The method recited in claim 16 wherein forming the high-density plasma from the heat gases comprises applying a source power distributed approximately equally between top and side sources.

19. The method recited in claim 10 wherein seasoning the processing chamber comprises:
    providing a flow of season precursors to the processing chamber;

forming a high-density plasma from the season precursors by applying at least 7500 W of source power distributed with greater than 70% of the source power at a top of the processing chamber; and depositing a season layer having a thickness of at least 5000 Å at one point with the high-density plasma.

* * * * *